United States Patent
Rivero et al.

(10) Patent No.: US 10,714,583 B2
(45) Date of Patent: Jul. 14, 2020

(54) MOS TRANSISTOR WITH REDUCED HUMP EFFECT

(71) Applicant: STMicroelectronics (Rousset) SAS, Rousset (FR)

(72) Inventors: Christian Rivero, Rousset (FR); Guilhem Bouton, Peynier (FR); Pascal Fornara, Pourrieres (FR); Julien Delalleau, Marseilles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/037,095

(22) Filed: Jul. 17, 2018

(65) Prior Publication Data
US 2019/0027565 A1 Jan. 24, 2019

(30) Foreign Application Priority Data
Jul. 21, 2017 (FR) ..................................... 17 56937

(51) Int. Cl.
*H01L 29/423* (2006.01)
*H01L 29/49* (2006.01)
(Continued)

(52) U.S. Cl.
CPC .... *H01L 29/4238* (2013.01); *H01L 21/28035* (2013.01); *H01L 21/28114* (2013.01); *H01L 21/823437* (2013.01); *H01L 21/823481* (2013.01); *H01L 29/0649* (2013.01); *H01L 29/0847* (2013.01); *H01L 29/42356* (2013.01); *H01L 29/42376* (2013.01);
(Continued)

(58) Field of Classification Search
None
See application file for complete search history.

(56) References Cited

U.S. PATENT DOCUMENTS 4,728,617 A 3/1988 Woo et al.
4,818,715 A 4/1989 Chao
(Continued)

FOREIGN PATENT DOCUMENTS

CN 103178096 A 6/2013
DE 19626089 A1 1/1998
(Continued)

OTHER PUBLICATIONS

INPI Search Report and Written Opinion for FR 1756937 dated Mar. 7, 2018 (7 pages).
(Continued)

*Primary Examiner* — Jay C Chang
(74) *Attorney, Agent, or Firm* — Crowe & Dunlevy

(57) ABSTRACT

A MOS transistor is produced on and in an active zone which includes a source region and a drain region. The active zone is surrounded by an insulating region. A conductive gate region of the transistor has two flanks which extend transversely to a source-drain direction, and the conductive gate region overlaps two opposite edges of the active zone act overlap zones. The conductive gate region includes, at a location of at least one overlap zone, at least one conductive tag which projects from at least one flank at a foot of the conductive gate region. The conductive tag covers a part of the active zone and a part of the insulating region.

49 Claims, 7 Drawing Sheets

(51) Int. Cl.
  *H01L 29/78* (2006.01)
  *H01L 29/06* (2006.01)
  *H01L 29/08* (2006.01)
  *H01L 21/28* (2006.01)
  *H01L 21/8234* (2006.01)

(52) U.S. Cl.
  CPC .......... *H01L 29/4983* (2013.01); *H01L 29/78* (2013.01); *H01L 29/7833* (2013.01)

(56) References Cited

U.S. PATENT DOCUMENTS

| | | |
|---|---|---|
| 5,837,588 A | 11/1998 | Wu |
| 5,976,932 A | 11/1999 | Kerber |
| 6,004,852 A | 12/1999 | Yeh et al. |
| 6,346,467 B1 | 2/2002 | Chang et al. |
| 7,557,404 B2 | 7/2009 | Koh et al. |
| 7,704,883 B2 | 4/2010 | Butler et al. |
| 7,723,235 B2 | 5/2010 | Kurihara et al. |
| 8,067,807 B2 | 11/2011 | Taya |
| 2002/0072173 A1 | 6/2002 | Aoki |
| 2003/0006463 A1* | 1/2003 | Ichikawa ............ H01L 27/0266 257/355 |
| 2005/0199939 A1 | 9/2005 | Lutze et al. |
| 2006/0170055 A1 | 8/2006 | Mitros et al. |
| 2009/0236654 A1 | 9/2009 | Ishihara et al. |
| 2010/0032772 A1 | 2/2010 | Tanaka |
| 2010/0158072 A1 | 6/2010 | Fornara et al. |
| 2013/0092987 A1 | 4/2013 | Lopez |
| 2014/0103440 A1 | 4/2014 | Chatterjee |
| 2014/0370680 A1 | 12/2014 | Cheng et al. |

FOREIGN PATENT DOCUMENTS

| | | |
|---|---|---|
| DE | 19747776 A1 | 7/1998 |
| EP | 1501130 A1 | 1/2005 |
| FR | 2826496 A1 | 12/2002 |
| FR | 2831713 A1 | 5/2003 |
| JP | 2001326289 A | 11/2001 |
| WO | 2005083769 A1 | 9/2005 |

OTHER PUBLICATIONS

Toshiyuki Oishi et al: "Isolation Edge Effect Depending on Gate Length of Mosfet's With Various Isolation Structures," IEEE Transactions on Electron Devices—IEEE Service Center, Pisacataway, NJ, US, vol. 47, No. 4, Apr. 1, 2000 (Apr. 1, 2000)—ISSN: 0018-9383 * p. 1-p. 2; Figure 1*.

* cited by examiner

MOS TRANSISTOR WITH REDUCED HUMP EFFECT

PRIORITY CLAIM

This application claims the priority benefit of French Application for Patent No. 1756937 filed on Jul. 21, 2017, the content of which is hereby incorporated by reference in its entirety to the maximum extent allowable by law.

TECHNICAL FIELD

Embodiments of the invention relate to integrated circuits, in particular the field-effect transistors, known in the prior art by the acronym "MOS" ("Metal Oxide Semiconductor"), incorporated into integrated circuits, and in particular the reducing of the "hump" effect at the active zone boundary.

BACKGROUND

FIG. 1 illustrates an exemplary integrated circuit CI comprising an MOS transistor T according to the prior art.

The MOS transistor T is produced on and in an active zone ZA surrounded by an insulating region 1, for example of the shallow trench type ("Shallow Trench Isolation", STI).

The active zone ZA comprises a doped drain region 2 and a doped source region 4 which are separated by a channel region 3 and made in a semi-conducting substrate.

The transistor T also comprises an insulated gate region 5 isolated from the active zone by a silicon oxide layer 6 (gate oxide).

In a conventional manner the drain, source and gate regions are silicided to allow contact pickups D, S, G on these regions.

The gate has a length L, extending in the source-drain direction, and this length can be equal to the technological node used for the production of an integrated circuit incorporating this transistor. Thus in a 40-nm technology, the length L can equal 40 nm.

The gate region 5 which extends transversely to the source-drain direction overlaps two opposite edges BD1 and BD2 of the active zone ZA at the level of two overlap zones ZCH1 and ZCH2, respectively.

At the level of the edges BD1 and BD2, the profile of the active zone exhibits a hump and a hollow.

This results in a non-uniform thickness of the gate oxide 6 in the overlap zones.

Moreover, in the active zone, in the neighborhood of the insulating region 1, the source side and drain side concentration of dopants is generally different from that situated at the center of the active zone, the reason for this being, inter alia, partial absorption of the dopants by the insulating region 1 during the implantation and diffusion of these dopants. Such is the case, for example, for boron used as dopant in nMOS transistors.

Such is also the case, but generally to a lesser extent, for the dopants of pMOS transistors.

It follows from this that parasitic transistors TP1 and TP2 are formed at the edges BD1 and BD2 of the active zone. More precisely the parasitic transistor TP1 possesses a part 20 of the drain region 2 and a part 40 of the source region 4 that are situated at the edge of the active zone ZA and a part 50 of the gate region 5 overlapping the edge BD1.

The parasitic transistor TP2 possesses a part 21 of the drain region 2 and a part 41 of the source region 4 that are situated at the edge of the active zone ZA and a part 51 of the gate region 5 overlapping the edge BD2.

These parasitic transistors, at the active zone edge, are shown schematically in FIG. 2 in which a central transistor T1, which is presumed to have the desired characteristics of the transistor T, has also been shown schematically.

The parasitic transistors TP1 and TP2 have a threshold voltage $Vt_p$ that is less than that of the central transistor T1. As the threshold voltage $Vt_p$ of the parasitic transistors is lower than that of the central transistor, the threshold voltage of the transistor T is de facto lower than that expected.

This effect is known in the prior art as the "hump effect".

A known scheme of the prior art making it possible to circumvent the hump effect provides for a modification of the transistor in such a way that its gate is of octagonal shape. FIG. 3 illustrates an integrated circuit CI1 comprising such a transistor T2. The drain D is then situated in the middle of the octagon.

However, this architecture of the transistor exhibits the drawback of increasing the size of the transistor. The surface area occupied by the transistor is more than doubled with respect to a transistor of conventional shape in comparable technology.

A need consequently exists to cancel or at least to reduce the "hump" effect while retaining the standard size of the transistor for a given technology, doing so by modifying only summarily the method for fabricating transistors.

SUMMARY

According to embodiments, it is advantageously proposed to incorporate on either side of the foot of the gate of the MOS transistor and at the active zone edge tags protruding on the active zone and the insulating region and thus to modify the threshold voltage of the parasitic transistors so as to compensate the "hump" effect and best restore the threshold voltage expected for the MOS transistor.

According to one aspect, there is proposed an integrated circuit comprising at least one MOS transistor produced on and in an active zone comprising a source region, a drain region, the active zone being surrounded by an insulating region, the transistor having a gate region comprising two flanks extending transversely to the source-drain direction, overlapping two opposite edges of the active zone, and possessing at the level of each overlap zone at least one tag projecting at the foot of at least one flank of the gate region and covering a part of the active zone and a part of the insulating region.

According to one embodiment, the integrated circuit can comprise a single tag per overlap zone, the two tags projecting from the same flank.

According to another possible embodiment, the integrated circuit comprises a single tag per overlap zone, the two tags projecting respectively from the two flanks.

According to yet another possible embodiment, the integrated circuit comprises two tags per overlap zone, the two tags projecting respectively from the two flanks.

The latter embodiment makes it possible to achieve better performance. Stated otherwise, this embodiment better compensates the "hump" effect.

Advantageously, the integrated circuit is produced in an L-nanometer technology, and the gate region comprises a central zone having a length reckoned in the source-drain direction, equal to L nanometers, the tags projecting from this central zone.

Thus there is no difference between the central zone of the gate of a transistor exhibiting tags and the conventional gate of a conventional transistor.

The gate region comprises on the flanks insulating lateral regions advantageously covering each tag.

According to one aspect, there is proposed a method for producing an MOS transistor produced on and in an active zone surrounded by an insulating region, comprising a formation of a gate region comprising two flanks extending transversely to the source-drain direction, overlapping two opposite edges of the active zone, and possessing at the level of each overlap zone at least one tag projecting at the foot of at least one flank of the gate region and covering a part of the active zone and a part of the insulating region.

According to one mode of implementation, the formation of the at least one tag comprises a first etching of a gate material layer so as to form a gate central zone and to leave a residual gate material layer remaining on either side of the central zone, and a second etching of the residual layer so as to form the at least one tag.

BRIEF DESCRIPTION OF THE DRAWINGS

Other advantages and characteristics of the invention will become apparent on examining the detailed description of wholly non-limiting embodiments, and appended drawings in which.

DETAILED DESCRIPTION

Figure 4:
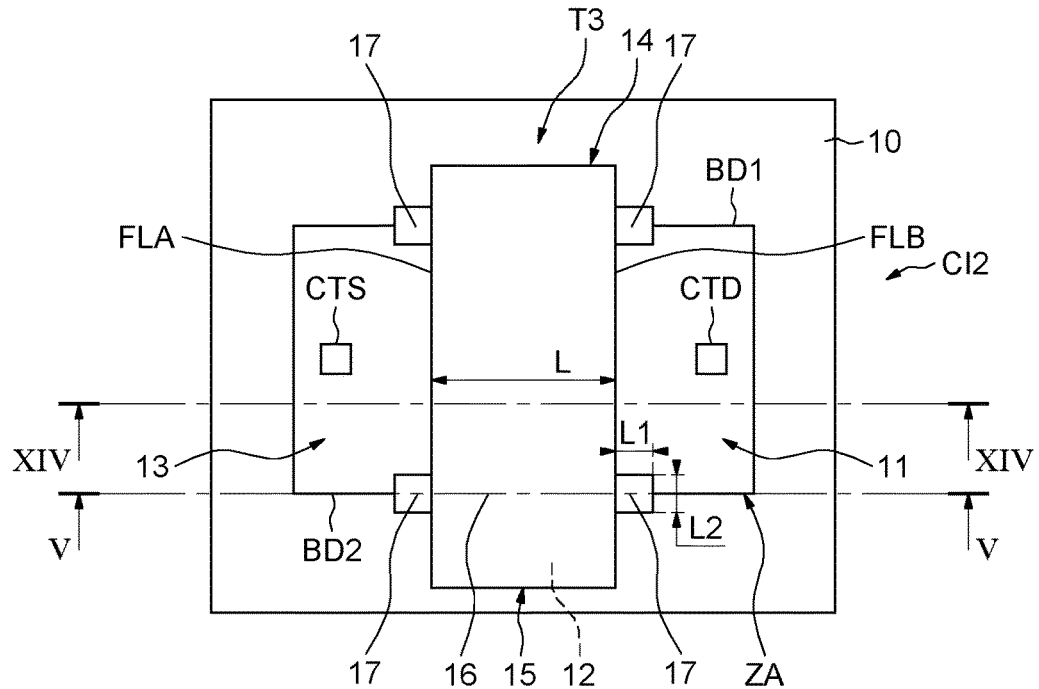
FIGS. 4-5 illustrate an exemplary embodiment of an integrated circuit comprising an MO S transistor.
Figure 5:
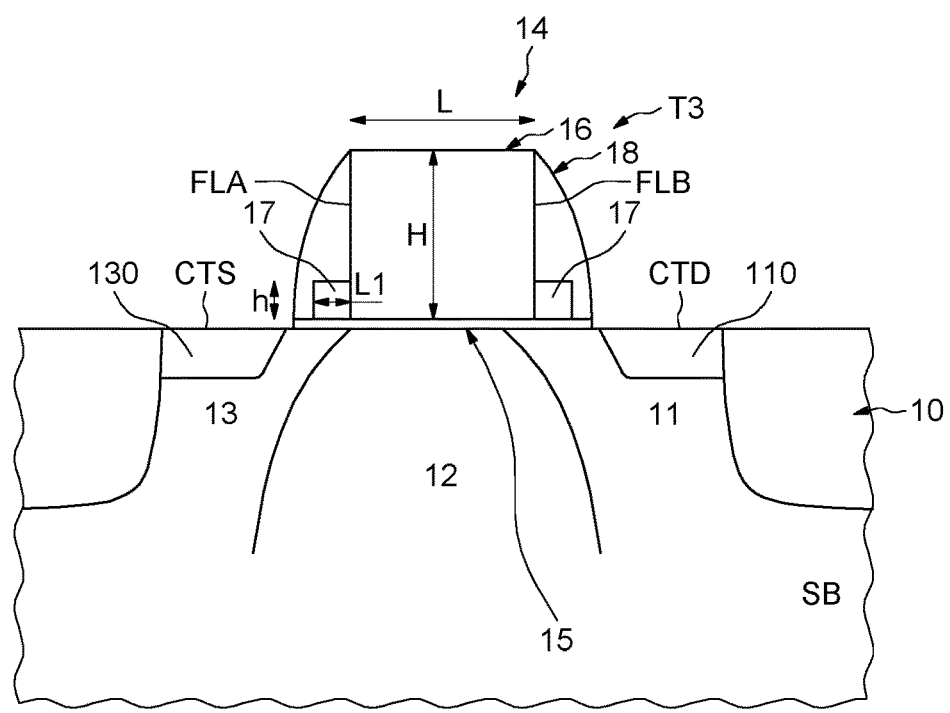

Reference is made to FIGS. 4-5 which represent an exemplary embodiment of an integrated circuit CI2 comprising an MOS transistor T3.

FIG. 5 is a sectional view of the integrated circuit of FIG. 4 on the line V-V of FIG. 4.

The MOS transistor T3 is produced on and in an active zone ZA surrounded by an insulating region 10, for example of the shallow trench type ("Shallow Trench Isolation", STI).

The active zone ZA comprises a doped drain region 11 and a doped source region 13 which are separated by a channel region 12 made in a semi-conducting substrate SB.

The substrate SB can be a bulk substrate or else a semi-conducting well, or else a semi-conducting film of a substrate of Silicon On Isolator (SOI) type.

In the case of an nMOS transistor, the drain and source regions are N-doped. The drain and source regions are P-doped for a pMOS transistor.

In a conventional manner the drain and source regions are silicided to allow contact pickups CTS, CTD.

The references 110 and 130 designate the silicided parts of the drain region 11 and source region 13.

The transistor T3 also comprises a gate region 14 isolated from the active zone by a dielectric layer 15. The gate region 14 comprises a conductive central zone 16 having a length L.

This length L is advantageously equal to the length L of a gate of a conventional transistor produced in an L-nm technology.

L is for example equal to 40 nm.

The central zone 16 of the gate region 14 protrudes beyond the active zone ZA so as to allow a contact pickup on the gate region 14. In this regard in practice the upper part of the whole of the gate region 14 is silicided.

The central zone 16 of the gate region 14 extends transversely to the source-drain direction and overlaps the two opposite edges BD1 and BD2 of the active zone.

At the level of each overlap zone, the gate region 14 possesses two conductive tags 17 respectively projecting at the foot (also referred to herein as the base or bottom) from the two flanks FLA and FLB of the central zone of the gate region 14 and each covering a part of the active zone ZA and a part of the insulating region 10. Schematically the tag 17 has the shape of a parallelepiped of height h, of length L1 and of width L2. The central zone of the gate comprises on the two flanks FLA and FLB insulating lateral regions 18 ("spacers") covering the tags 17.

The tags 17 can be of the same dimensions or of different dimensions.

The width L2 is equal for example to the minimum dimension of the technology of the transistor. For example for a 40-nm technology equal to 40 nm, L2 is of the order of 40 nm.

As will be seen in detail hereinafter, these tags 17 will make it possible, during the doping of the drain region and source region, to locally modify the doping profile of these regions and thus modify the electrical characteristics of the parasitic transistors and therefore those of the transistor T3, in particular the threshold voltage of the parasitic transistors. Indeed, the tags 17 form an additional thickness for the dopants to pass through.

By way of example for L equal to 40 nm and tags situated on either side and at the ends of the gate region, protruding on the active zone of the transistor and the insulating region, of height h equal to 15 nm, of length L1 equal to 15 nm and of width L2 equal to 40 nm, it is possible to compensate 100 mV of threshold voltage loss for the transistor T3. That said, the person skilled in the art will know to tailor the dimensional values of the tags as a function of the compensation desired in respect of the threshold voltage of the transistor T3.

An exemplary method for fabricating an MOS transistor produced on and in an active zone and having a gate comprising tags on either side at its foot is now described while referring more particularly to FIGS. 6 to 13 which are sectional views on the line V-V of FIG. 4.

Here the conductive gate region is made of polysilicon.

The critical dimension CD of the transistor is equal to 40 nm here. This transistor technology being commonplace, the doping masks used in the fabrication of these transistors according to the invention are the same as those of the conventional transistors customarily produced in this technology.

The elements identical to those described previously are identified by the same numerical references.

Figure 6:
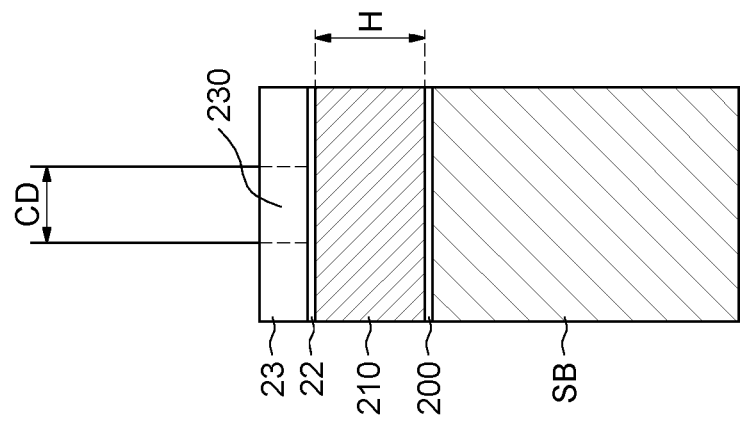
FIGS. 6-12 illustrate a process for fabricating the MOS transistor.

FIG. 6 illustrates a first step in which a first etching of a resin layer for a CD equal to 40 nm is carried out.

More precisely, there is formed in a conventional and known manner on the substrate SB surmounted by a silicon dioxide layer 200, surmounted by a polysilicon layer 210, itself surmounted by a hard mask layer 22, surmounted by a resin layer 23. The resin 23 is etched by photolithography, using an etching mask of CD equal to 40 nm, so as to leave only a resin block 230 remaining.

Here the polysilicon layer 210 has a height H, for example of 80 nm.

Figure 7:
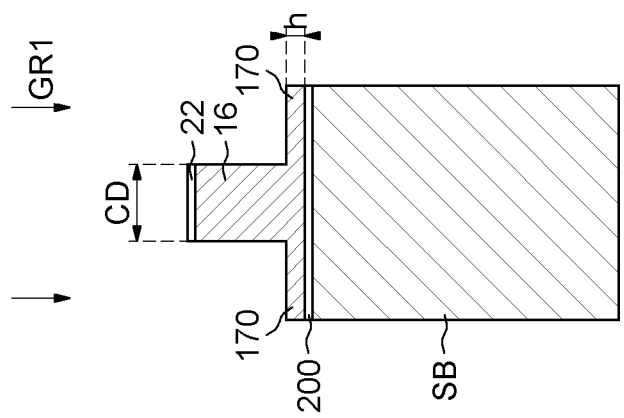

In a second step illustrated in FIG. 7, a first conventional etching GR1 is carried out, using the resin block 230 as etching mask. The polysilicon layer 210 is plasma etched in time so as to leave polysilicon lands 170 remaining, at the foot of the central zone 16, of height h projecting from the flanks of the central zone 16 and extending over the entire width (reckoned transversely to the length L) in such a way that each land overlaps the active zone ZA and the insulating zone 10.

Figure 8:
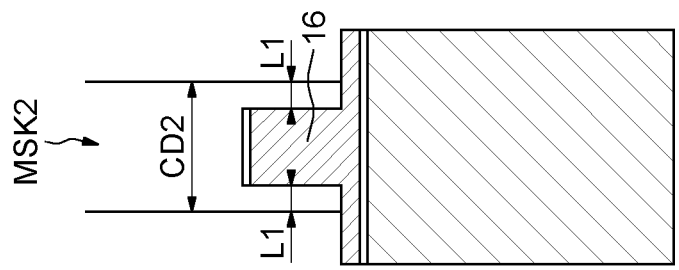

Next, in step 3 illustrated in FIG. 8, a second resin mask MSK2 is produced in a conventional manner having at the level of the edges of the active zone a length CD2, for example 70 nm, greater than the length CD, and a length CD between the edges of the active zone.

The resin mask MSK2 protrudes from each side of the central zone 16 of the gate by a length L1, equal for example to 15 nm, which will define the length of the tags. The mask will also make it possible to eliminate in the subsequent etching step, the residue of the lands 170 which is situated between the tags.

Figure 9:
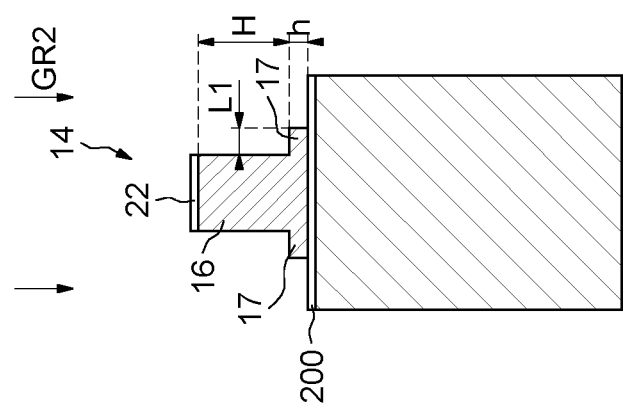

In step 4 illustrated in FIG. 9, the selective plasma etching GR2 is carried out. This yields the gate 14 comprising the central zone 16 of length L and height H between the tags, and also the tags 17 of length L1, of width L2 and of height h which project from the central zone 16 and which cover a part of the active zone and a part of the insulating region 10.

Figure 10:
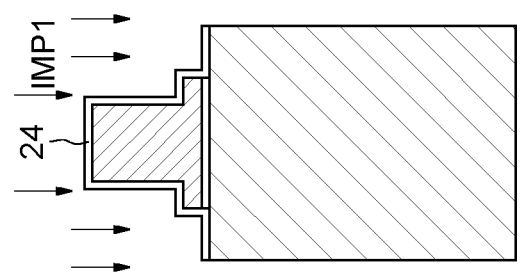
Figure 11:
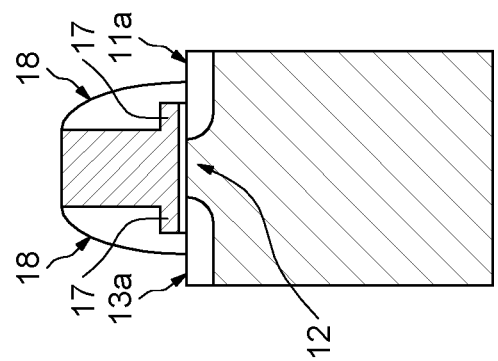

In step 5 of the method, illustrated in FIG. 10, a silicon dioxide layer 24 is deposited on the gate 14 and the surface of the substrate SB, followed by a first implantation of dopants IMP1 so as to obtain the implanted regions 11a and 13a on either side of the channel region 12 (FIG. 11).

Next, in step 6, the spacers 18 are produced in a conventional manner. They cover in particular the tags 17.

Figure 12:
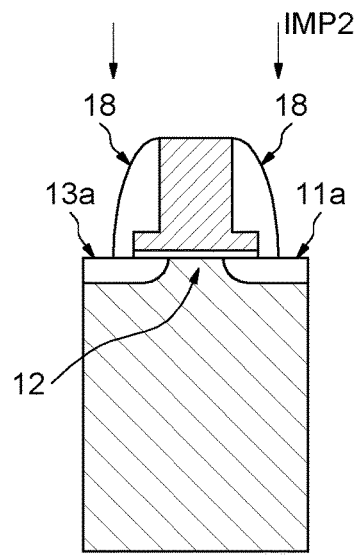

In step 7, as illustrated in FIG. 12, a second implantation of dopants IMP2 is carried out so as to obtain the transistor T3.

Figure 13:
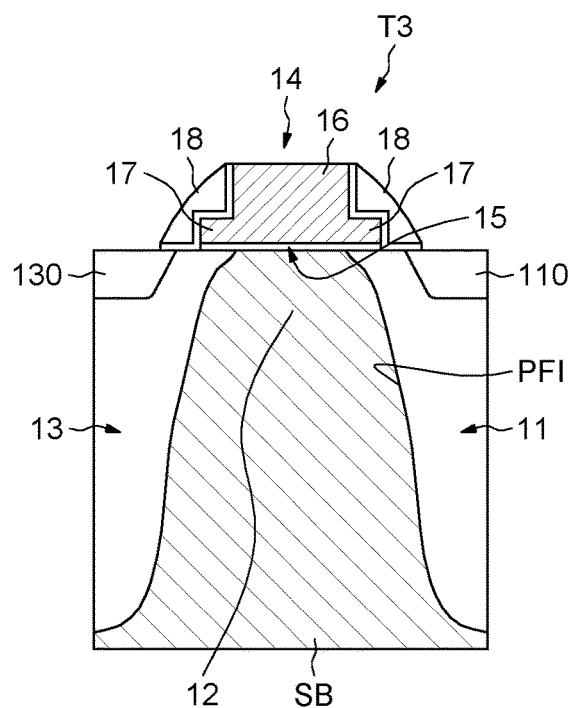
FIGS. 13-14 illustrate cross sections of the fabricated MOS transistor.
Figure 14:
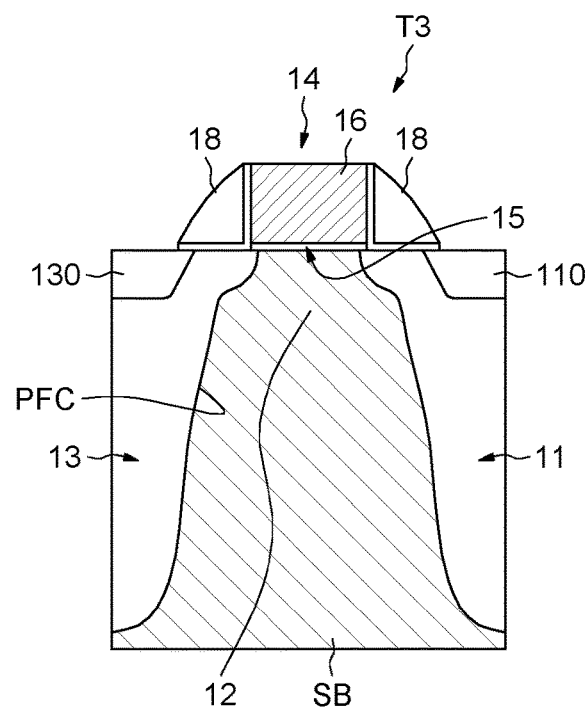

FIG. 13 illustrates the profile of dopants PFI under the tags 17 on the line V-V of FIG. 4 and FIG. 14 illustrates the profile of dopants PFC under the central part 16 on the line XIV-XIV of FIG. 4.

It is noted that the dopants profile PFI under the tags 17 is different from the conventional profile PFC.

The dopants profile PFI situated under the tags 17 extends less deeply than the conventional profile PFC.

Advantageously, the tags modify the distribution of the dopants in the drain, source and gate regions under the tags during the doping step of the method for fabricating the transistors.

This modification of the doping profile gives rise to a modification of the electrical properties of the parasitic transistors incorporated in the transistor, in particular an increase in their threshold voltage $Vt_p$, thereby making it possible to reduce or indeed to eliminate the hump effect.

The method which has just been described leads to the creation of a single additional gate etching mask and to a further two steps in the method for fabricating the transistor, without modifying the conventional steps for fabricating MOS transistors. Moreover, the critical dimension CD of the transistor is retained, the doping masks used during the steps for fabricating conventional transistors are also retained.

Although the embodiment illustrated in FIGS. 4 and 5 is preferable in terms of performance, the invention is not limited to the embodiment as described in FIGS. 4 and 5 but embraces all variants thereof.

Figure 15:
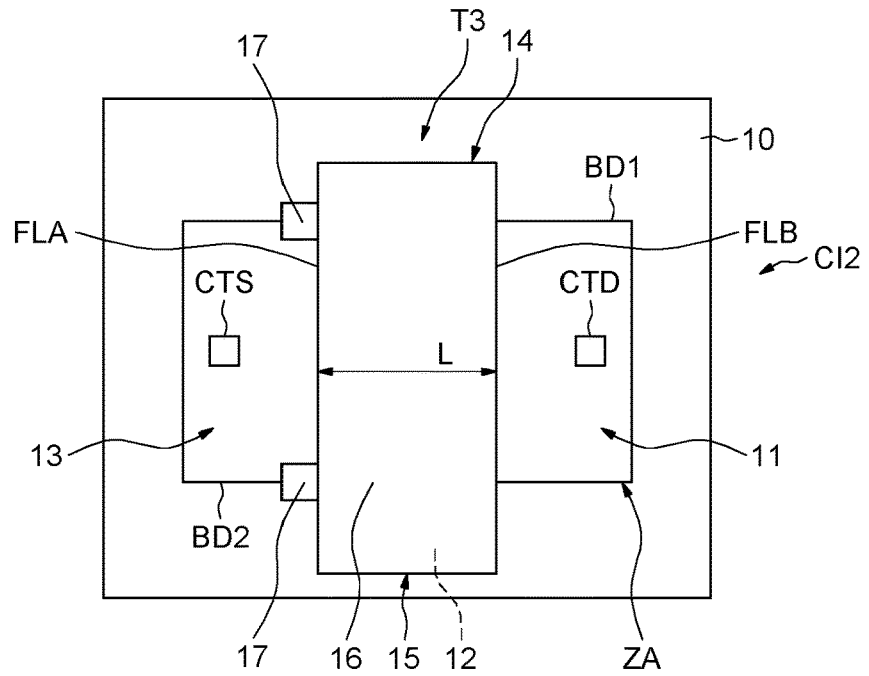
FIGS. 15-16 illustrate alternate embodiments of the MOS transistor.

As a variant, it is possible for each overlap zone to comprise a single tag 17, the two tags projecting from the same flank FLA, as is illustrated in FIG. 15. Of course they could project from the flank FLB.

Figure 16:
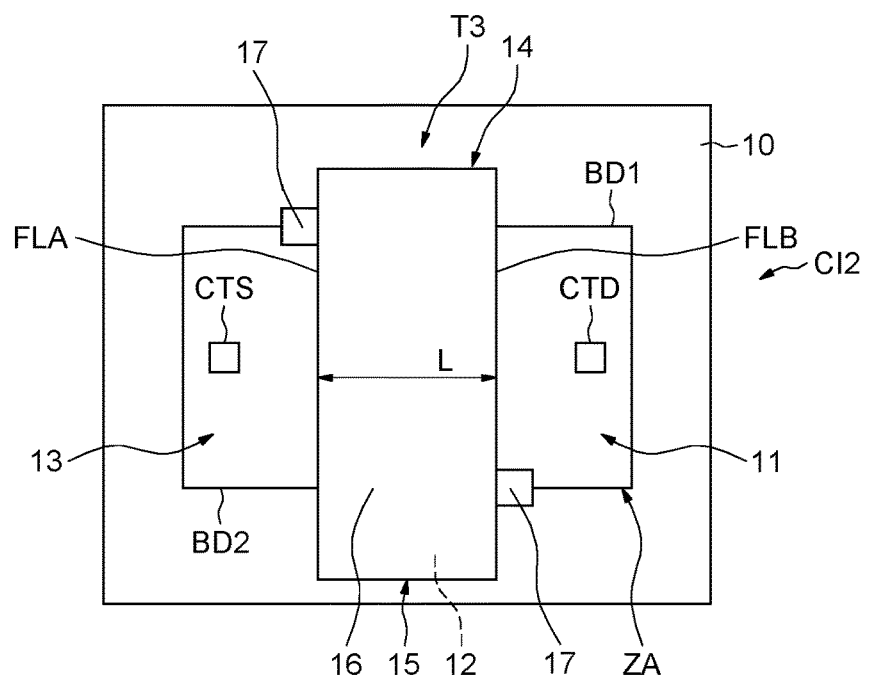

As a variant, it is possible for each overlap zone to comprise a single tag 17, the two tags projecting respectively from the flanks FLA and FLB as illustrated in FIG. 16. Whilst in FIG. 16, the drain side tag projects from the flank FLB and the source side tag projects from the flank FLA, it would be possible to invert the configuration, that is to say to have a drain side tag projecting from the flank FLA and a source side tag projecting from the flank FLB.

Here again in these two variants, the tags might not have the same dimensions.

Figure 1:
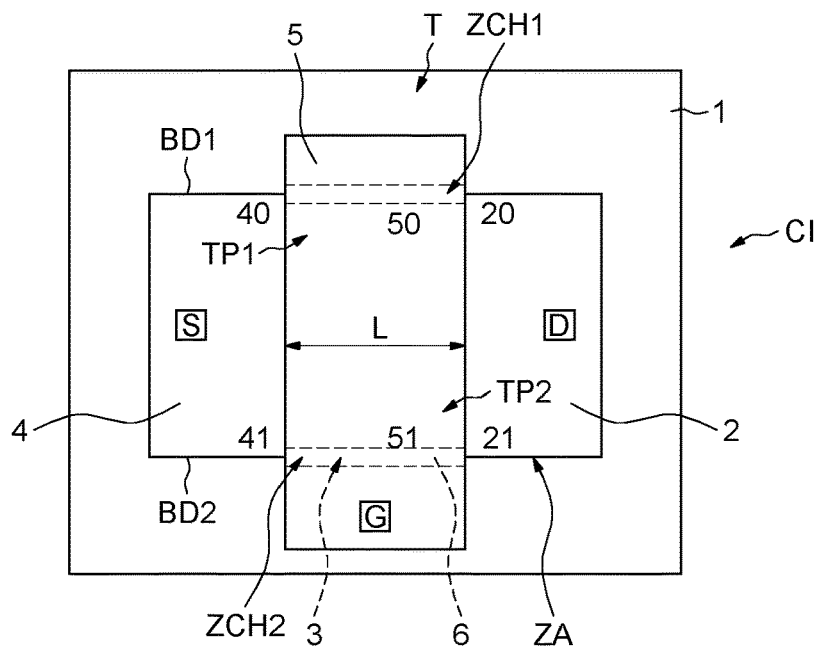
FIGS. 1-3 illustrate an integrated circuit comprising an MOS transistor according to the prior art.
Figure 2:
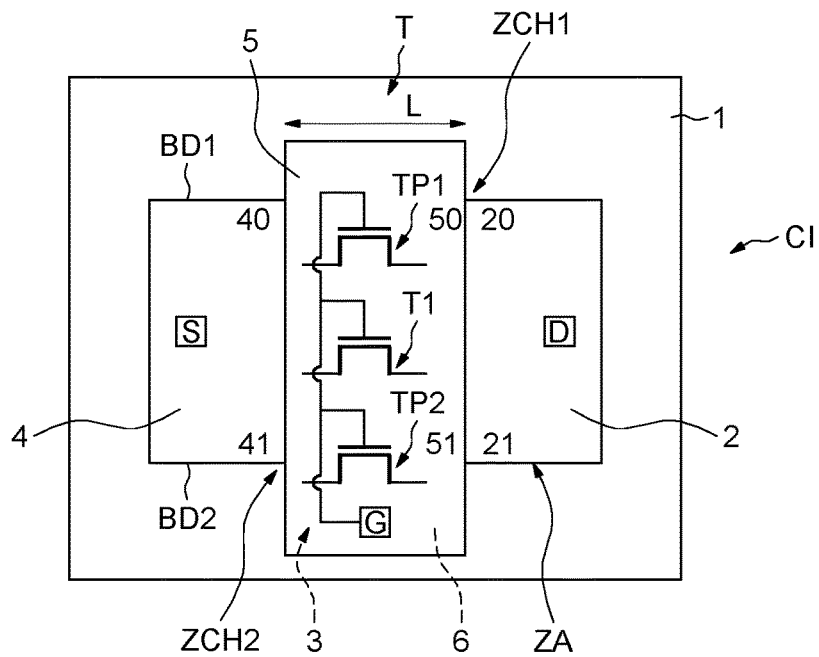
Figure 3:
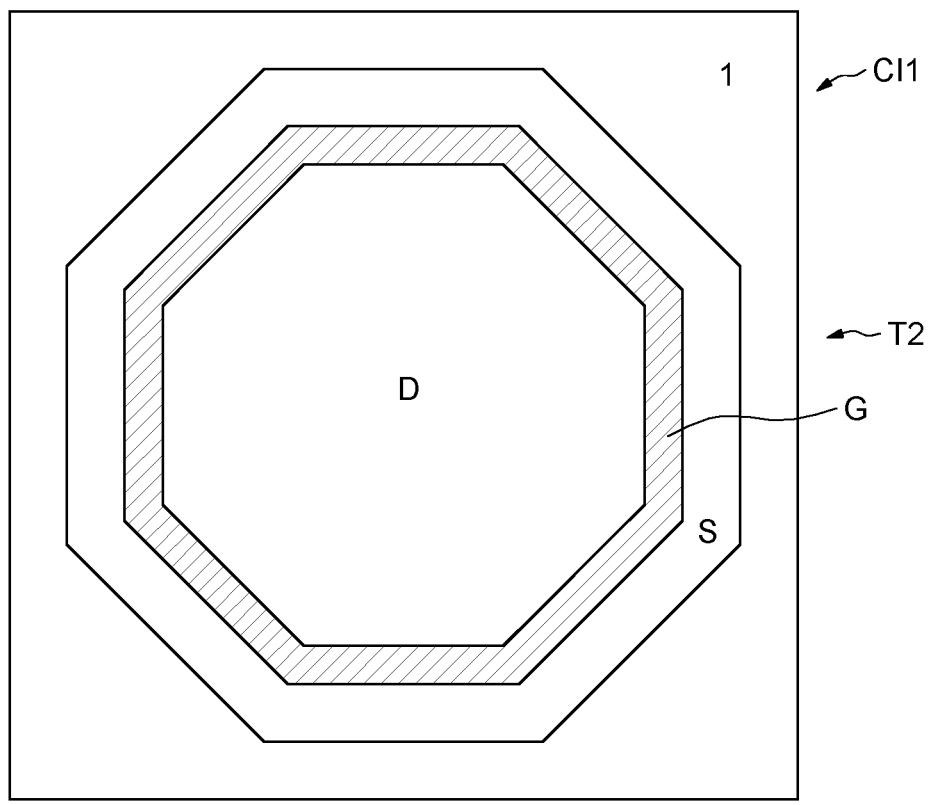

It will be understood that an integrated circuit device may comprise, on one and same substrate, a transistor of the type shown in FIG. 1 and a transistor of the type shown in FIG. 4. These two transistors may be provided in separate active areas, or in a common active area.

The invention claimed is:

1. An integrated circuit including at least one metal oxide semiconductor (MOS) transistor, comprising:
   an active zone including a source region and a drain region of the at least one MOS transistor, the active zone being surrounded by an insulating region;
   a conductive gate region of the at least one MOS transistor extending transversely to a source-drain direction and overlapping two opposite edges of the active zone at overlap zones;
   wherein the conductive gate region includes a central zone having a first height, a first flank facing the source region and a second flank, opposite the first flank, facing the drain region; and
   wherein the conductive gate region further includes, at a location of at least one overlap zone, at least one conductive tag projecting perpendicularly from one of the first and second flanks of the central zone and covering a part of the active zone and a part of the insulating region, the at least one conductive tag having a second height which is less than the first height.

2. The integrated circuit according to claim 1, wherein the conductive gate region includes one conductive tag per overlap zone.

3. The integrated circuit according to claim 1, wherein the conductive gate region includes a pair of conductive tags projecting perpendicularly from said one of the first and second flanks of the central zone.

4. The integrated circuit according to claim 1, wherein the conductive gate region includes a pair of conductive tags projecting perpendicularly from each of the first and second flanks of the central zone.

5. The integrated circuit according to claim 1, wherein the conductive gate region includes a pair of conductive tags per overlap zone, the conductive tags projecting perpendicularly respectively from the first and second flanks of the central zone.

6. The integrated circuit according to claim 1, further comprising insulating spacers on the first and second flanks of the conductive gate region, wherein the insulating spacers completely cover said first and second flanks and sides and a top surface of the at least one conductive tag.

7. The integrated circuit according to claim 1, wherein the central zone of the conductive gate region has a length L extending in the source-drain direction, and wherein the at least one conductive tag projects perpendicularly from said one of the first and second flanks of the central zone with a distance L1 that is less than L.

8. The integrated circuit according to claim 7, wherein the at least one conductive tag has a width L2 extending perpendicular to the source-drain direction, wherein L2 is less than L.

9. The integrated circuit according to claim 8, wherein L2=L1.

10. The integrated circuit according to claim 7, wherein the length L is a critical dimension length for a transistor technology used for producing the integrated circuit.

11. The integrated circuit according to claim 1, further comprising insulating spacers adjacent the first and second flanks of the conductive gate region and completely covering top and sides of the at least one conductive tag.

12. The integrated circuit according to claim 1, further including at least one further MOS transistor, wherein said at least one further MOS transistor has a conductive gate region that does not include any perpendicularly projecting conductive tags.

13. The integrated circuit according to claim 12, wherein the at least one MOS transistor and the at least one further MOS transistor are located in a same active zone.

14. The integrated circuit according to claim 12, wherein the at least one further MOS transistor is located in a different active zone than the at least one MOS transistor.

15. The integrated circuit according to claim 1, further comprising:
a dielectric layer between the conductive gate region and an upper surface of the active zone;
insulating spacers adjacent the first and second flanks of the conductive gate region and completely covering top and sides of the at least one conductive tag;
wherein a peripheral edge of the insulating spacers is aligned with a peripheral edge of the dielectric layer.

16. The integrated circuit according to claim 1, further comprising:
a dielectric layer between the conductive gate region and an upper surface of the active zone;
insulating spacers adjacent the first and second flanks of the conductive gate region and completely covering top and sides of the at least one conductive tag;
wherein a peripheral edge of the at least one conductive tag is aligned with a peripheral edge of the dielectric layer and the insulating spacers cover the aligned peripheral edges of the at least one conductive tag and dielectric layer.

17. An integrated circuit including at least one metal oxide semiconductor (MOS) transistor, comprising:
an active zone including a source region and a drain region of the at least one MOS transistor, the active zone being surrounded by an insulating region;
a conductive gate region of the at least one MOS transistor extending transversely to a source-drain direction and overlapping two opposite edges of the active zone at overlap zones;
wherein the conductive gate region includes a central zone having a first thickness; and
wherein the conductive gate region further includes, at a location of at least one overlap zone, at least one conductive tag projecting perpendicularly from the central zone and covering a part of the active zone and a part of the insulating region, the at least one conductive tag having a second thickness which is less than the first thickness.

18. The integrated circuit according to claim 17, wherein the conductive gate region includes one conductive tag per overlap zone.

19. The integrated circuit according to claim 17, wherein the conductive gate region includes a pair of conductive tags projecting perpendicularly from a flank of the central zone which faces one of the source region or drain region.

20. The integrated circuit according to claim 17, wherein the conductive gate region includes a pair of conductive tags projecting perpendicularly from opposite flanks of the central zone which face the source region and drain region, respectively.

21. The integrated circuit according to claim 17, wherein the conductive gate region includes a pair of conductive tags per overlap zone, the conductive tags projecting perpendicularly respectively from opposite flanks of the central zone which face the source region and drain region, respectively.

22. The integrated circuit according to claim 17, further comprising insulating spacers on flanks of the conductive gate region which face the source region and drain region, wherein the insulating spacers completely cover said flanks and sides and a top surface of the at least one conductive tag.

23. The integrated circuit according to claim 17, wherein the central zone of the conductive gate region has a length L extending in the source-drain direction, and wherein the at least one conductive tag projects perpendicularly from a flank of the central zone which faces one of the source region or drain region with a distance L1 that is less than L.

24. The integrated circuit according to claim 23, wherein the at least one conductive tag has a width L2 extending perpendicular to the source-drain direction, wherein L2 is less than L.

25. The integrated circuit according to claim 24, wherein L2=L1.

26. The integrated circuit according to claim 23, wherein the length L is a critical dimension length for a transistor technology used for producing the integrated circuit.

27. The integrated circuit according to claim 17, further comprising insulating spacers adjacent flanks of the conductive gate region which face the source and drain regions and completely covering top and sides of the at least one conductive tag.

28. The integrated circuit according to claim 17, further including at least one further MOS transistor, wherein said at least one further MOS transistor has a conductive gate region that does not include any perpendicularly projecting conductive tags.

29. The integrated circuit according to claim 28, wherein the at least one MOS transistor and the at least one further MOS transistor are located in a same active zone.

30. The integrated circuit according to claim 28, wherein the at least one further MOS transistor is located in a different active zone than the at least one MOS transistor.

31. The integrated circuit according to claim 17, further comprising:
a dielectric layer between the conductive gate region and an upper surface of the active zone;
insulating spacers adjacent flanks of the conductive gate region which face the source and drain regions and completely covering top and sides of the at least one conductive tag;
wherein a peripheral edge of the insulating spacers is aligned with a peripheral edge of the dielectric layer.

32. The integrated circuit according to claim 17, further comprising:
a dielectric layer between the conductive gate region and an upper surface of the active zone;

insulating spacers adjacent flanks of the conductive gate region which face the source and drain regions and completely covering top and sides of the at least one conductive tag;

wherein a peripheral edge of the at least one conductive tag is aligned with a peripheral edge of the dielectric layer and the insulating spacers cover the aligned peripheral edges of the at least one conductive tag and dielectric layer.

33. An integrated circuit, including:
a first metal oxide semiconductor (MOS) transistor, comprising:
an active zone including a source region and a drain region of the at least one MOS transistor, the active zone being surrounded by an insulating region;
a first conductive gate region of the first MOS transistor extending transversely to a source-drain direction and overlapping two opposite edges of the active zone at overlap zones;
wherein the first conductive gate region includes a central zone having a first height; and
wherein the first conductive gate region further includes, at a location of at least one overlap zone, at least one conductive tag projecting perpendicularly from the central zone and covering a part of the active zone and a part of the insulating region, the at least one conductive tag having a second height which is less than the first height; and
a second MOS transistor, wherein said second MOS transistor has a second conductive gate region that does not include any perpendicularly projecting conductive tags, wherein the first MOS transistor and the second MOS transistor are located in a same active zone.

34. The integrated circuit according to claim 33, wherein the first conductive gate region includes one conductive tag per overlap zone.

35. The integrated circuit according to claim 33, wherein the first conductive gate region includes a pair of conductive tags projecting perpendicularly from one flank of the central zone.

36. The integrated circuit according to claim 33, wherein the first conductive gate region includes a pair of conductive tags projecting perpendicularly from opposite flanks of the central zone.

37. The integrated circuit according to claim 33, wherein the first conductive gate region includes a pair of conductive tags per overlap zone, the conductive tags projecting perpendicularly respectively from opposite flanks of the central zone.

38. An integrated circuit, including:
a first metal oxide semiconductor (MOS) transistor, comprising:
an active zone including a source region and a drain region of the at least one MOS transistor, the active zone being surrounded by an insulating region;
a first conductive gate region of the first MOS transistor extending transversely to a source-drain direction and overlapping two opposite edges of the active zone at overlap zones;
wherein the first conductive gate region includes a central zone having a first height; and
wherein the first conductive gate region further includes, at a location of at least one overlap zone, at least one conductive tag projecting perpendicularly from the central zone and covering a part of the active zone and a part of the insulating region, the at least one conductive tag having a second height which is less than the first height; and
a second MOS transistor, wherein said second MOS transistor has a second conductive gate region that does not include any perpendicularly projecting conductive tags, wherein the second MOS transistor is located in a different active zone than the first MOS transistor.

39. The integrated circuit according to claim 38, wherein the first conductive gate region includes one conductive tag per overlap zone.

40. The integrated circuit according to claim 38, wherein the first conductive gate region includes a pair of conductive tags projecting perpendicularly from one flank of the central zone.

41. The integrated circuit according to claim 38, wherein the first conductive gate region includes a pair of conductive tags projecting perpendicularly from opposite flanks of the central zone.

42. The integrated circuit according to claim 38, wherein the first conductive gate region includes a pair of conductive tags per overlap zone, the conductive tags projecting perpendicularly respectively from opposite flanks of the central zone.

43. An integrated circuit including at least one metal oxide semiconductor (MOS) transistor, comprising:
an active zone including a source region and a drain region of the at least one MOS transistor, the active zone being surrounded by an insulating region;
a conductive gate region of the at least one MOS transistor extending transversely to a source-drain direction and overlapping two opposite edges of the active zone at overlap zones;
wherein the conductive gate region includes a central zone having a first height;
wherein the conductive gate region further includes, at a location of at least one overlap zone, at least one conductive tag projecting perpendicularly from the central zone and covering a part of the active zone and a part of the insulating region, the at least one conductive tag having a second height which is less than the first height; and
insulating spacers adjacent flanks of the conductive gate region and completely covering top and sides of the at least one conductive tag.

44. The integrated circuit according to claim 43, wherein the conductive gate region includes one conductive tag per overlap zone.

45. The integrated circuit according to claim 43, wherein the conductive gate region includes a pair of conductive tags projecting perpendicularly from one flank of the central zone.

46. The integrated circuit according to claim 43, wherein the conductive gate region includes a pair of conductive tags projecting perpendicularly from opposite flanks of the central zone.

47. The integrated circuit according to claim 43, wherein the conductive gate region includes a pair of conductive tags per overlap zone, the conductive two tags projecting perpendicularly respectively from opposite flanks of the central zone.

48. The integrated circuit according to claim 43, further comprising:
a dielectric layer between the conductive gate region and an upper surface of the active zone;
wherein a peripheral edge of the insulating spacers is aligned with a peripheral edge of the dielectric layer.

49. The integrated circuit according to claim 48, wherein the insulating spacers cover the aligned peripheral edges of the at least one conductive tag and dielectric layer.

* * * * *